(12) United States Patent
Kwon et al.

(10) Patent No.: US 9,282,640 B2
(45) Date of Patent: Mar. 8, 2016

(54) INTERCONNECTION ELEMENT WITH POSTS FORMED BY PLATING

(71) Applicant: Tessera, Inc., San Jose, CA (US)

(72) Inventors: Jinsu Kwon, Campbell, CA (US); Kimitaka Endo, Tokyo (JP); Sean P. Moran, Burlingame, CA (US)

(73) Assignee: Tessera, Inc., San Jose, CA (US)

( * ) Notice: Subject to any disclaimer, the term of this patent is extended or adjusted under 35 U.S.C. 154(b) by 68 days.

(21) Appl. No.: 13/929,291

(22) Filed: Jun. 27, 2013

(65) Prior Publication Data

US 2013/0286619 A1    Oct. 31, 2013

Related U.S. Application Data

(62) Division of application No. 12/228,890, filed on Aug. 15, 2008, now Pat. No. 8,505,199.

(60) Provisional application No. 60/964,823, filed on Aug. 15, 2007, provisional application No. 61/004,308, filed on Nov. 26, 2007.

(51) Int. Cl.
*H05K 1/11* (2006.01)
*H01R 9/00* (2006.01)
(Continued)

(52) U.S. Cl.
CPC .............. *H05K 1/11* (2013.01); *H01L 21/4853* (2013.01); *H01L 21/6835* (2013.01);
(Continued)

(58) Field of Classification Search
CPC . H01L 23/53228; H01L 21/486; H01L 24/76; H05K 2203/0108; H05K 2201/09045
USPC ............................ 174/261, 267, 264; 361/774
See application file for complete search history.

(56) References Cited

U.S. PATENT DOCUMENTS

| 4,591,411 | A | 5/1986 | Reimann |
| 5,000,818 | A | 3/1991 | Thomas et al. |

(Continued)

FOREIGN PATENT DOCUMENTS

| JP | 63045888 A | 2/1988 |
| JP | 11-509990 A | 8/1999 |

(Continued)

OTHER PUBLICATIONS

International Search Report for International Application No. PCT/US2008/009840 dated Feb. 19, 2009.
(Continued)

*Primary Examiner* — Chau N Nguyen
*Assistant Examiner* — Roshn Varghese
(74) *Attorney, Agent, or Firm* — Lerner, David, Littenberg, Krumholz & Mentlik, LLP

(57) ABSTRACT

An interconnection element is provided for conductive interconnection with another element having at least one of microelectronic devices or wiring thereon. The interconnection element includes a dielectric element having a major surface. A plated metal layer including a plurality of exposed metal posts can project outwardly beyond the major surface of the dielectric element. Some of the metal posts can be electrically insulated from each other by the dielectric element. The interconnection element typically includes a plurality of terminals in conductive communication with the metal posts. The terminals can be connected through the dielectric element to the metal posts. The posts may be defined by plating a metal onto exposed co-planar surfaces of a mandrel and interior surfaces of openings in a mandrel, after which the mandrel can be removed.

19 Claims, 13 Drawing Sheets

(51) Int. Cl.
  *H01L 21/48*   (2006.01)
  *H01L 21/683*  (2006.01)
  *H01L 23/498*  (2006.01)
  *H05K 3/40*    (2006.01)
  H01L 23/00     (2006.01)
  H05K 3/20      (2006.01)
  H05K 3/46      (2006.01)

(52) U.S. Cl.
  CPC ....... *H01L 23/498* (2013.01); *H01L 23/49811* (2013.01); *H01L 23/49822* (2013.01); *H01L 24/16* (2013.01); *H05K 3/4007* (2013.01); H01L 24/05 (2013.01); H01L 2221/68345 (2013.01); H01L 2224/13099 (2013.01); H01L 2224/16 (2013.01); H01L 2924/01005 (2013.01); H01L 2924/01006 (2013.01); H01L 2924/01013 (2013.01); H01L 2924/01027 (2013.01); H01L 2924/01029 (2013.01); H01L 2924/01033 (2013.01); H01L 2924/01078 (2013.01); H01L 2924/01079 (2013.01); H01L 2924/01082 (2013.01); H01L 2924/01322 (2013.01); H01L 2924/12042 (2013.01); H01L 2924/14 (2013.01); H01L 2924/181 (2013.01); H05K 3/205 (2013.01); H05K 3/4644 (2013.01); H05K 2201/0367 (2013.01); H05K 2203/0384 (2013.01); Y10T 29/4913 (2015.01); Y10T 29/49124 (2015.01); Y10T 29/49155 (2015.01); Y10T 29/49165 (2015.01); Y10T 29/49204 (2015.01)

(56) References Cited

U.S. PATENT DOCUMENTS

| | | | |
|---|---|---|---|
| 5,117,276 A | | 5/1992 | Thomas et al. |
| 5,327,011 A | | 7/1994 | Iwamatsu |
| 5,334,804 A | | 8/1994 | Love et al. |
| 5,387,812 A | | 2/1995 | Forouhi et al. |
| 5,703,331 A * | 12/1997 | Brodsky et al. | 174/254 |
| 5,747,358 A | | 5/1998 | Gorrell et al. |
| 5,773,889 A | | 6/1998 | Love et al. |
| 5,918,153 A | | 6/1999 | Morgan |
| 6,085,414 A | | 7/2000 | Swarbrick et al. |
| 6,175,158 B1 | | 1/2001 | Degani et al. |
| 6,351,885 B2 * | 3/2002 | Suzuki et al. | 29/847 |
| 6,403,481 B1 | | 6/2002 | Matsuda et al. |
| 6,419,149 B1 | | 7/2002 | Yano et al. |
| 6,445,069 B1 | | 9/2002 | Ling et al. |
| 6,528,874 B1 | | 3/2003 | Iijima et al. |
| 6,586,334 B2 | | 7/2003 | Jiang |
| 6,667,552 B1 | | 12/2003 | Buynoski |
| 6,713,835 B1 | | 3/2004 | Horak et al. |
| 6,869,750 B2 | | 3/2005 | Zhang et al. |
| 6,897,568 B2 | | 5/2005 | Haimerl et al. |
| 6,921,977 B2 | | 7/2005 | Shimizu et al. |
| 7,112,520 B2 | | 9/2006 | Lee et al. |
| 7,495,179 B2 * | 2/2009 | Kubota et al. | 174/260 |
| 7,605,467 B2 * | 10/2009 | Fujii et al. | 257/733 |
| 2002/0076919 A1 | | 6/2002 | Peters et al. |
| 2003/0155653 A1 | | 8/2003 | Iijima et al. |
| 2004/0259292 A1 | | 12/2004 | Beyne et al. |
| 2005/0097727 A1 | | 5/2005 | Iijima et al. |
| 2005/0181544 A1 | | 8/2005 | Haba et al. |
| 2005/0185382 A1 | | 8/2005 | Ooi et al. |
| 2006/0170110 A1 | | 8/2006 | Akram et al. |
| 2009/0145645 A1 | | 6/2009 | Kwon et al. |
| 2009/0148594 A1 | | 6/2009 | Moran et al. |

FOREIGN PATENT DOCUMENTS

| | | |
|---|---|---|
| JP | 2001-111189 A | 4/2001 |
| JP | 2002359471 | 12/2002 |
| JP | 2003309370 | 10/2003 |
| JP | 2004152884 A | 5/2004 |
| JP | 2005093930 A | 4/2005 |
| WO | 9746061 A1 | 12/1997 |

OTHER PUBLICATIONS

Japanese Office Action for Application No. 2010-521052 dated Oct. 23, 2012.
Japanese Patent Application No. 2007-295299.
Office Action from U.S. Appl. No. 12/228,896 mailed Oct. 4, 2011.
Response to Office Action from U.S. Appl. No. 12/228,896 dated Jan. 18, 2012.

* cited by examiner

INTERCONNECTION ELEMENT WITH POSTS FORMED BY PLATING

CROSS-REFERENCE TO RELATED APPLICATIONS

The present application is a divisional of U.S. patent application Ser. No. 12/228,890 filed on Aug. 15, 2008, which claims the benefit of U.S. Provisional Application Nos. 60/964,823 filed Aug. 15, 2007 and 61/004,308 filed Nov. 26, 2007, the disclosures of which are hereby incorporated herein by reference.

BACKGROUND OF THE INVENTION

The subject matter of the present application relates to microelectronic interconnection elements and assemblies and fabrication methods therefor, and more particularly to microelectronic interconnection elements and assemblies having protruding metal posts, especially metal posts defined by plating.

A current need exists to provide interconnection elements, e.g., chip carriers, package substrates, substrates of multiple chip modules, and other similar elements, for flip-chip interconnection with microelectronic elements having fine-pitch contacts. With traditional technologies such as solder-to-solder interconnections, e.g., arrays of high melting temperature solder bumps, or screen-printing technology, it is becoming increasingly difficult to form conductive bumps of sufficient volume, especially when the pitch of the conductive bumps is smaller than 150 microns.

SUMMARY OF THE INVENTION

In accordance with an aspect of the invention, an interconnection element, e.g., a package substrate, circuit panel, or other such element, is provided for conductive interconnection with another element having at least one of microelectronic devices or wiring thereon. The interconnection element can include a sheet-like dielectric element having a major surface. A plated metal layer can be provided thereon which includes a plurality of exposed metal posts projecting outwardly beyond the major surface of the dielectric element. Some or all of the metal posts can be electrically insulated from each other by the dielectric element. The posts can be defined by plating a metal onto exposed co-planar surfaces of a mandrel and interior surfaces of openings in a mandrel and subsequently removing the mandrel. The interconnection element may further include a plurality of terminals in conductive communication with the metal posts. The terminals may be connected through the dielectric element to the metal posts.

In accordance with one embodiment, the interconnection element may include a plurality of metal wiring traces which extend in at least one direction along the major surface of the dielectric element. One or more of the metal wiring traces can be electrically insulated from the metal posts and one or more of the wiring traces can be conductively connected to the posts. Alternatively, one, some or all of the metal wiring traces can be electrically insulated from the posts. Portions of the dielectric element can be disposed between the at least one metal wiring trace and the adjacent metal posts, for example, in one or more directions along the major surface of the dielectric element for electrically insulating such metal wiring trace from the posts. In another alternative, one, some or all of the metal wiring traces can be conductively connected to the posts. For example, a metal wiring trace can be connected to one of the metal posts adjacent to the trace in a direction along the major surface of the dielectric element.

In one embodiment, one or more metal wiring traces can be disposed between adjacent ones of the metal posts and insulated from the adjacent metal posts.

In one embodiment, a portion of the metal layer can extend in a direction along the major surface of the dielectric element and be joined to at least one of the metal posts.

In one embodiment, the metal layer can be a first metal layer, and the interconnection element includes at least one second metal layer which connects the terminals with the metal posts through the dielectric element. In one embodiment, the second metal layer can be conductively joined to bases of the metal posts.

In one embodiment, the metal posts can have a height of at least 35 microns from the major surface and a pitch smaller than about 150 microns. Each metal post can be formed with a specific shape, such as, for example, frusto-conical or essentially cylindrical.

In one embodiment, the interconnection element can be conductively connected to one or more other elements to form an assembly. For example, in one embodiment, a microelectronic assembly can include a packaged microelectronic element in which the metal posts of the interconnection element are conductively interconnected to contacts, e.g., bond pads, of one or more microelectronic elements such as a bare semiconductor chip having an integrated circuit thereon or a packaged semiconductor chip including a semiconductor chip and a package having terminals other than the bond pads of the chip. A semiconductor chip can be mounted to the interconnection element in a "face-down" or "flip-chip" orientation with the front face of the chip facing the interconnection element. Alternatively, the semiconductor chip can be mounted in a "face-up" orientation with the front face of the chip facing away from the interconnection element. In one example, a microelectronic element is mounted in a face-down orientation with the interconnection element. The microelectronic element may include a plurality of exposed contacts having a pitch, wherein the metal posts have a pitch matching the pitch of the contacts and the metal posts are conductively joined to the contacts.

In a particular embodiment, the metal layer of the interconnection element includes an inner metal layer adjacent to the dielectric element and an outer metal layer overlying the inner metal layer. The inner metal layer can be formed, for example, by plating a metal onto the outer metal layer. In one example, the outer metal layer may include nickel and the inner metal layer includes copper.

In one embodiment, a microelectronic assembly or package may include an interconnection element and a microelectronic element having a plurality of exposed contacts arranged at a pitch. In such assembly, the metal posts of the interconnection element can have a pitch matching the pitch of the contacts, with the metal posts being joined to the contacts.

In accordance with an aspect of the invention, a method is provided for fabricating an interconnection element, wherein the interconnection element can have raised conductive posts for conductive interconnection with another element having at least one of microelectronic devices or wiring thereon. In such method, conductive posts can be formed within a plurality of holes of a first element. In one example, each conductive post can include a metal liner lining walls of the holes. Terminals of the interconnection element can be formed which are in conductive communication with the conductive posts. The terminals may be connected to the conductive posts through structure extending through a dielectric layer.

The conductive posts can then be caused to project outwardly beyond a major surface of the interconnection element, such as by partially or fully removing the first element. The first element or portion thereof can be removed after forming the terminals, for example. In one example, the first is removed by etching the first element selectively relative to a metal liner of each conductive post which lines walls of the holes in the first element.

In one embodiment, the first element may include a first metal and the metal liner can include a second metal. The second metal may be such that it resists attack by an etchant used to selectively etch the first element.

In one embodiment, the step of forming metal posts can include forming a second metal layer in contact with the metal liner within the holes. In a particular embodiment, the metal liner within the holes can be formed by processing including plating. The second metal layer can be formed by steps including plating. In one embodiment, the second metal layer may fill the holes.

The second metal layer may include the first metal. The first metal can be copper, for example, and the metal liner may include nickel, for example.

In one embodiment, the first element can include a metal sheet which consists essentially of copper and the holes can have a pitch less than about 150 microns. The first element can be formed by laser drilling through holes in a metal sheet and joining a carrier to a face of the metal sheet to cover the through holes. The first element can be formed, for example, by mechanically forming through holes in a metal sheet and joining a carrier to a face of the metal sheet to cover the through holes.

In a particular embodiment, the metal or conductive posts can frusto-conical shape. In one embodiment, the metal or conductive posts can have cylindrical shape.

In accordance with an aspect of the invention, a method is provided for fabricating an interconnection element. In accordance with such method, conductive posts can be formed within a plurality of blind holes of a first element which includes a first metal. Each conductive post can have a liner including a second metal lining the holes and a layer including a third metal contacting the liner within the holes, the second metal being resistant to attack by an etchant which attacks the first metal. A plurality of terminals can be formed such that the terminals are exposed at a bottom surface of a dielectric layer and are in conductive communication with the conductive posts. At least a portion of the first element can be removed using the etchant to cause at least portions of the conductive posts to protrude beyond the surface of the dielectric layer. In one embodiment, this can be done after the posts and terminals are formed.

BRIEF DESCRIPTION OF THE DRAWINGS

FIGS. 3 through 12A are fragmentary sectional views illustrating a series of stages subsequent to the stage illustrated in FIG. 1 in a method of fabricating an interconnection element in accordance with one embodiment.

DETAILED DESCRIPTION

In accordance with an embodiment, a method is described herein for fabricating an interconnection element having raised conductive posts formed by plating, the posts usable to conductively connect the interconnection element to another element such as a microelectronic element or a wiring element, such as a circuit panel. As discussed herein, through use of an interconnection element having protruding conductive posts, interconnection can be provided to microelectronic elements or other elements having arrays of exposed contacts. In a particular example, the conductive posts of an interconnection element described herein can connect to contacts of a microelectronic element which are arranged at a fine pitch, for example, at a pitch less than 150 microns as measured center-to-center.

Figure 1:
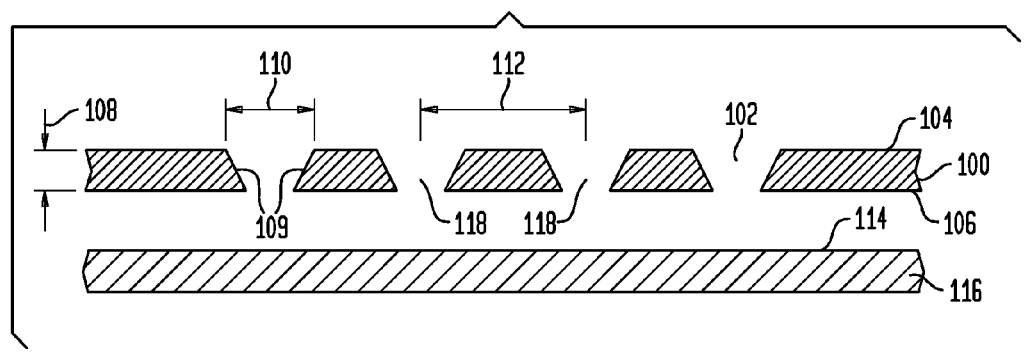
FIG. 1 is a fragmentary sectional view (through line 1-1 of FIG. 2) illustrating a preliminary stage in a method of fabricating an interconnection element in accordance with one embodiment.
Figure 2:
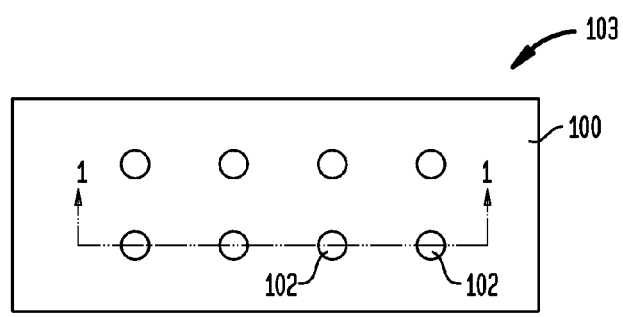
FIG. 2 is a fragmentary plan view corresponding to the sectional view illustrated in FIG. 1 in a method of fabricating an interconnection element in accordance with one embodiment.

As illustrated in FIG. 1, an element 100 (shown in fragmentary sectional view) is patterned to form a plurality of through holes 102 extending between a top surface 104 of the element and a bottom surface 106 remote from the top surface. The element 100 has a thickness 108 between the top and bottom surfaces which can range from a few tens of microns to a few hundred microns. The thickness 108 typically is uniform over the area 103 defined by the top surface of the element 100, as shown in FIG. 2 (plan view). The element can be conductive, or can incorporate a nonconductive or semi-conductive element. In one example, the element is a sheet or foil which consists essentially of metal. For example, the element can be a foil consisting essentially of copper.

The through holes 102 (FIGS. 1-2) can be formed by optical ablation or mechanically, among other possible methods. For example, the through holes can be formed by drilling using a laser such as an ultraviolet wavelength (UV) YAG laser, i.e., one made from yttrium aluminum garnet (YAG) which typically is doped with neodymium or other dopant. Holes produced by such UV YAG laser have walls 109 which are nearly vertical, i.e., at relatively small angles to the vertical direction, where "vertical" is defined by a normal angle to the top surface 104. Thus, the walls 109 slant inward such that the width 110 of the through holes becomes smaller in the direction from the top surface towards the bottom surface.

Through holes in an element having a thickness 108 of 70 microns can be drilled to widths 110, such as 50 microns, and can be arranged at a pitch 112, such as 60 microns. Of course, through holes having greater widths and pitch or smaller widths and pitch can be attained within such element.

Figure 3:
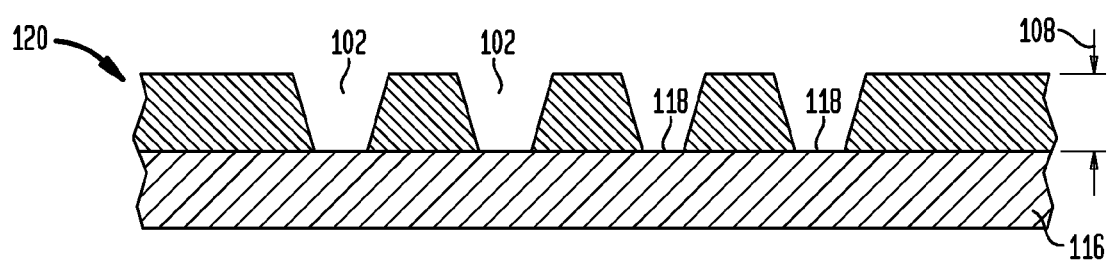

After forming the through holes, the bottom surface 106 of the element 100 then is joined to a major surface 114 of a carrier 116 to form a structure 120 as shown in FIG. 3. Carrier 116 may consist essentially of a metal sheet or other element having a conductive major surface 114 aligned with the bottom ends 118 of the through holes, for example. When the element 100 and carrier 116 both consist essentially of copper, they can be joined together by pressing the surfaces 106, 112 (FIG. 1) together at a joining temperature of approximately 350 degrees Celsius. Typically, the top surface 114 of the carrier 116 is a planar surface when joined to a planar bottom surface 106 of the element 100 such that bottom ends 118 of the through holes 102 become closed off by the carrier 116, as illustrated in FIG. 3. The structure formed by combining element 100 with the carrier 116 is a conductive mandrel 118 on which a set of conductive posts will be formed by plating in subsequent processing.

Figure 4:
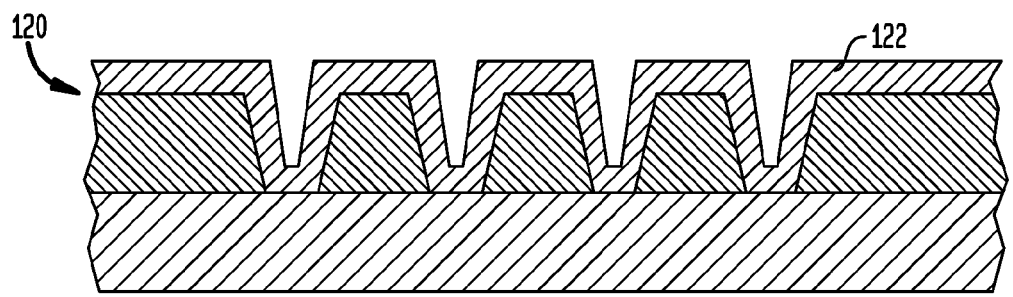

As illustrated in FIG. 4, a first metal layer 122 can be electroplated onto the conductive mandrel 118 so as to form a metal liner 122. Alternatively, the metal liner 122 can be formed by using a metal laminate (patterned or unpatterned), electroless plating, chemical vapor deposition (CVD) or physical vapor deposition (PVD) (sputtering), among others. The first metal layer can consist essentially of a metal which is not attacked by an etchant that attacks the underlying metal of the conductive mandrel 118. For example, when the conductive mandrel 118 consists essentially of copper, the first metal can include or consist essentially of a metal such as nickel. Such nickel layer is plated or deposited to a submicron thickness or to a thickness of a few microns, for example, 3 microns. Etchants are known which can be used to etch copper features while selectively preserving nickel features with which they come in contact. The importance of the type of metal used in the first metal layer will become apparent from the description of subsequent processing below.

Figure 5:
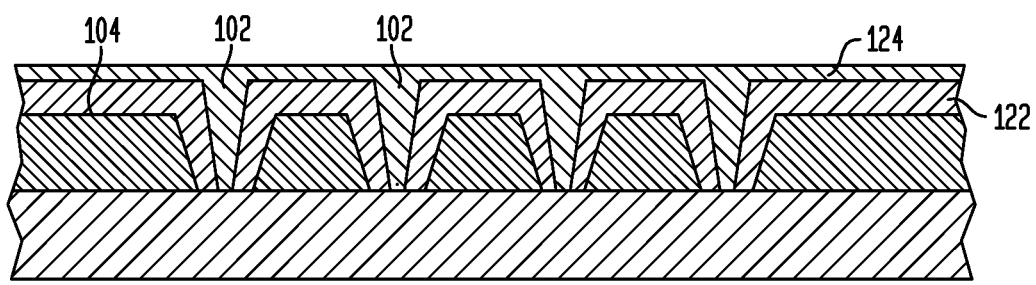

As illustrated in FIG. 5, a second metal layer 124 is placed onto the first metal layer 122. The second metal layer overlies the metal liner 122 and fills the remaining space within the holes 102. The placement of the second metal layer can be done using techniques like those described above. In one example, an electroplating process is used. An electroplating process typically results in the second metal layer also overlying the top surface 104 of the mandrel. In a particular embodiment, the second metal layer includes or consists essentially of copper.

Figure 6:
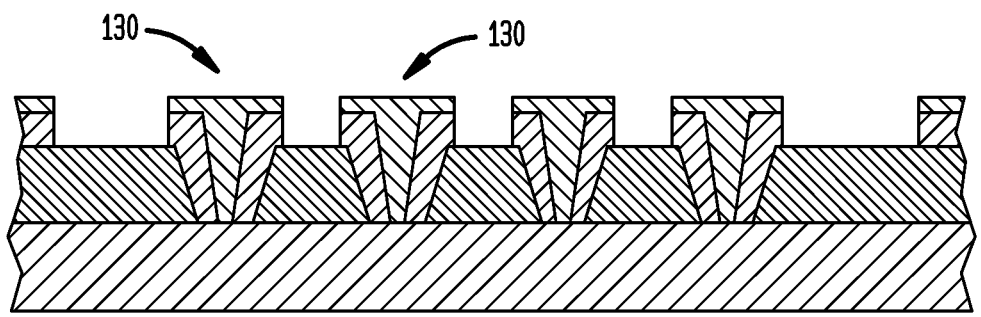

FIG. 6 illustrates a stage of processing after patterning the first and second metal layers into individual separate conductive posts 130. The first and second metal layers can be patterned, for example, by photolithographically patterning a resist layer overlying the metal layers and etching each metal layer, in turn, using an etchant appropriate therefor.

Figure 7:
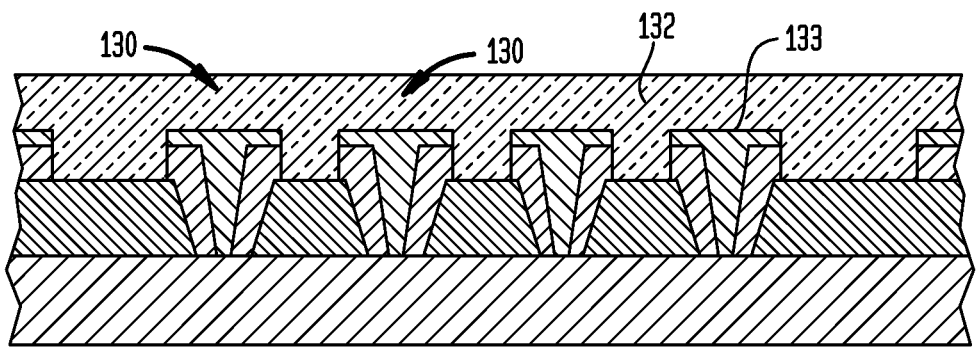

Subsequently, as illustrated in FIG. 7, a dielectric layer 132 is formed such that it overlies the exposed bases 133 of the conductive posts 130. The dielectric layer can be formed by any suitable method such as by pressing or laminating a partially cured layer thereto, with or without the application of heat, or can be formed using a flowable dielectric material which optionally may be hardened or densified through subsequent treatment such as heating.

Figure 8:
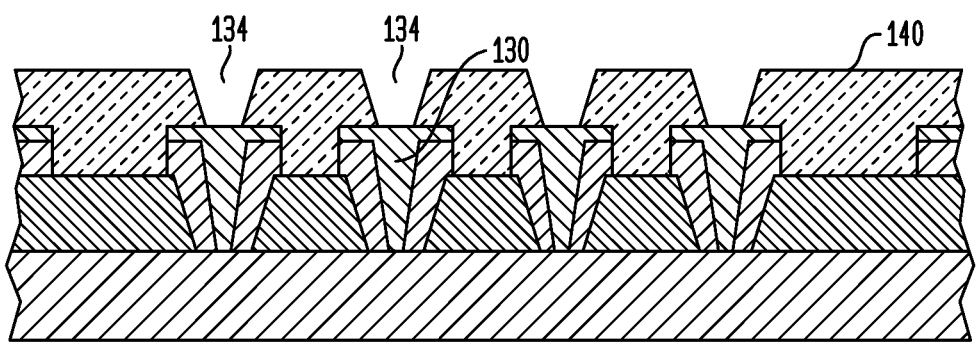

Thereafter, as illustrated in FIG. 8, the dielectric layer 132 is patterned to form openings 134 extending downward from a top surface 140 of the dielectric layer 130 to expose at least portions of the conductive posts. The openings 134 are formed in alignment, e.g., in axial alignment, with the conductive posts 130. In one example, the dielectric layer 132 can be patterned by photolithographically patterning openings in a resist layer (not shown) atop the dielectric layer, followed by etching the dielectric layer through the openings in the resist layer. Alternatively, the openings can be formed by laser drilling with a CO2 laser or excimer laser, for example.

Figure 9:
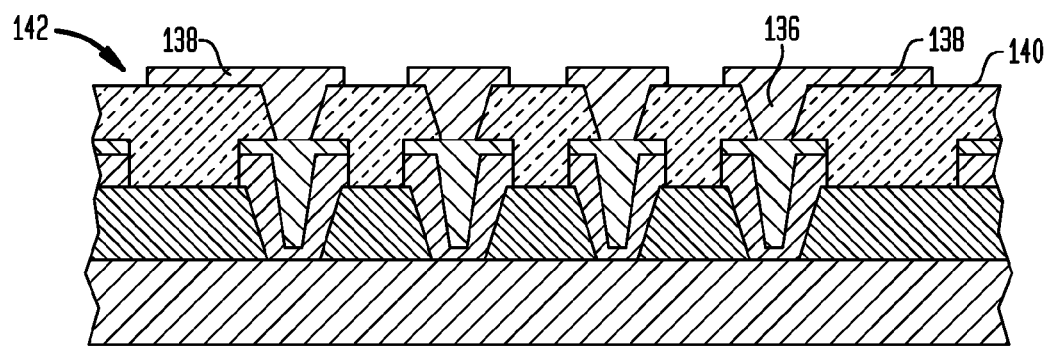

Thereafter, as illustrated in FIG. 9, a third metal layer is placed onto the structure to form conductive vias 136 filling the holes, as well as a metal layer 142 extending along the top surface 140. In one example, the third metal is electroplated onto the structure. The third metal layer can consist essentially of copper. A seed layer may be first formed on the dielectric layer prior to plating the third metal layer thereon. FIG. 9 illustrates the third metal layer after subsequent patterning to form individual traces 138 extending along the top surface.

Figure 10:
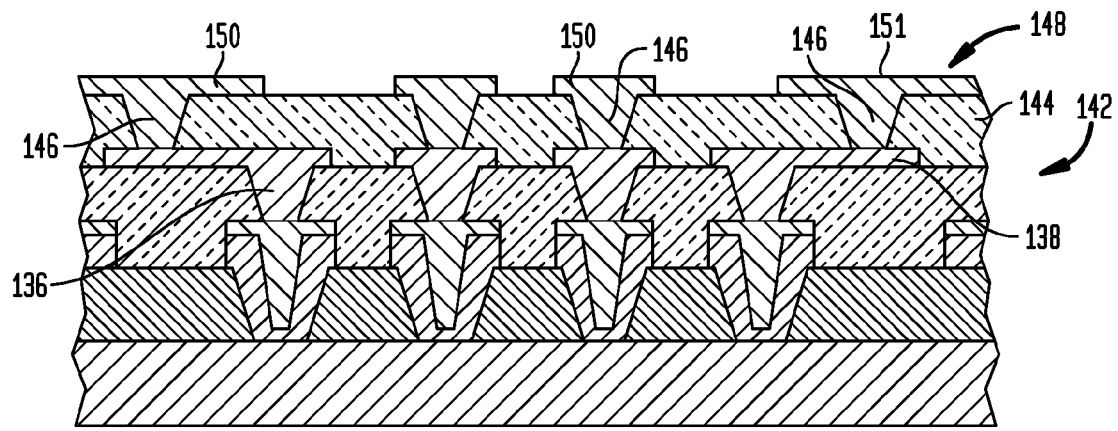

Subsequently, as illustrated in FIG. 10, a second dielectric layer 144 is formed and holes are patterned therein. A fourth metal layer then is electroplated thereon to fill the holes in the second dielectric layer, forming second conductive vias 146 and traces 150 of a second metal layer 148 atop the dielectric layer 144. The second dielectric layer 144 can be formed and patterned in similar manner to the first dielectric layer 132 and the fourth metal layer can be formed and patterned in similar manner to the third metal layer. In one example, the fourth metal layer consists essentially of copper. Through such processing, the structure now includes two wiring layers 142, 146 at different levels which are conductively interconnected by conductive vias 146. Each of the wiring layers 142, 146 may include metal lines or metal traces 138, 148 which are oriented in the same direction or in different directions from each other. In this way, metal lines 138 can be used to conductively connect the vias 136 and metal lines 150 can be used to connect vias 146. Wiring layer 148 may also include conductive pads 151 overlying some of the vias 146.

Figure 11:
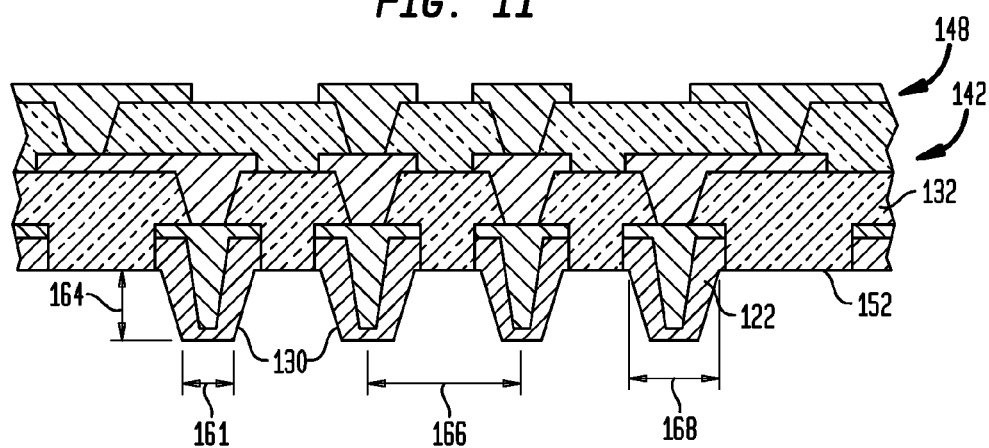

Thereafter, as illustrated in FIG. 11, the conductive mandrel is removed from the structure. For example, the conductive mandrel 118 can be a sacrificial structure which is removed by selectively etching the material of the mandrel so as to preserve the material of the metal liner 122 within the holes. In a particular example, the mandrel can be a sacrificial element made from a material such as copper, which can be etched selectively in relation to a material of the metal liner 122, e.g., nickel.

To remove the mandrel in this way, exposed surfaces of the second metal layer 148 can be covered temporarily by a protective layer and an etchant applied to selectively attack the material of the mandrel 118 until the metal liner 122 becomes exposed as an outer layer of conductive posts 130. During such etching process, a major surface (bottom surface 152) of the dielectric layer 132 also becomes exposed. As a result, the conductive posts now project outwardly beyond the exposed bottom surface 152 of the dielectric layer 132. The resulting conductive posts may have different possible shapes. For example, the posts may have frusto-conical shape, of which tips 160 can be flat or essentially flat. Alternatively, the posts may be cylindrical in shape. Other shapes are also possible, which may include posts which are elongated in a horizontal direction, i.e., in a direction parallel to the major surface 152 of the dielectric element, such that the posts may appear as rails protruding from the dielectric element 132.

The conductive posts extend a height 164 from an exposed major surface 152 of the dielectric layer. In one embodiment, the height can range from a few tens of microns to a few hundred microns, depending on the depth of the holes 102 within the mandrel 118 (FIG. 3) used to form the conductive posts. The pitch 166, defined as the distance between centers of adjacent conductive posts, can range upwards from several tens of microns. The conductive posts at the bases thereof have width 168 which can range upwards from a few tens of microns. At tips 160, the conductive posts can have width 161 which may be the same, nearly the same, or somewhat smaller than the width 168 at the base of the conductive posts. In a particular example, the height 164 of each post is approximately 70 microns, the width 168 at the base is approximately 60 microns, and the width 161 at the tip of approximately 50 microns is nearly the same as the base width 168. In such example, the pitch 166 can range upwards from 80 microns, for example, a pitch of 100 microns.

Through fabrication of the conductive posts using mandrel 118 having holes of regular height 108 (FIG. 3), the tips of the conductive posts can be made co-planar to facilitate joining of the conductive posts with co-planar features of another conductive element. Moreover, through use of a mandrel 118 conductive posts 130 can be produced which have broad tips having the same width or nearly the same width as the bases of the posts. These features can be beneficial when joining the conductive posts to lands, conductive pads or conductive bumps of another microelectronic element, e.g., a semiconductor chip having devices thereon, or a wiring element, e.g., a circuit panel.

Figure 12A:
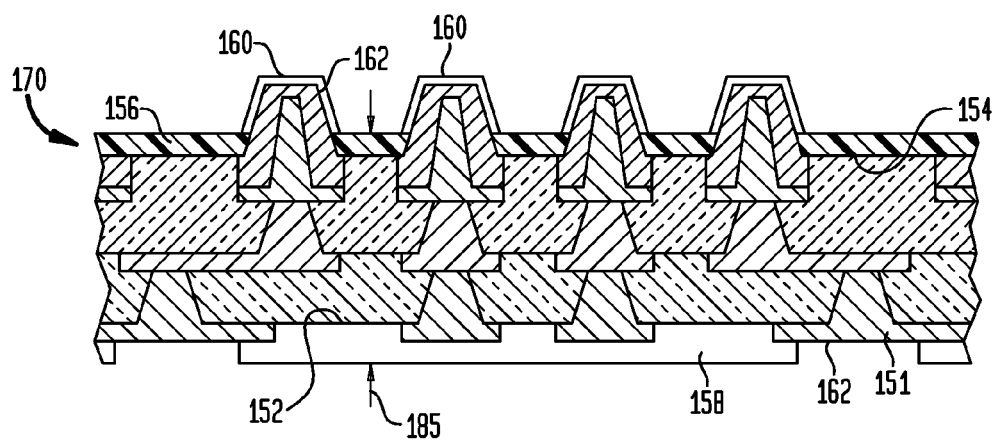

In subsequent processing, as illustrated in FIG. 12A, solder masks 156, 156 may be formed overlying each of the bottom and major surfaces 152, 152 of the dielectric layer. The view shown in FIG. 12 is inverted in relation to that shown in FIG. 11. Optionally, a finish metal layer 162 such as gold or other metal may be applied to exposed tips 160 of the posts and terminals 151 exposed within openings in solder mask 158.

The interconnection element 170 (FIG. 12A) can be relatively thin, having a sheet-like dielectric element 187 formed by the combination of dielectric layers 132 and 144 with a thickness 185 from as little as a few tens of microns. The dielectric element typically has lateral dimensions in directions along its major surface 176 (in a direction of the pitch 166 of posts and a second direction transverse thereto) which range upwards from a few millimeters to one hundred millimeters or more. The dielectric element can be flexible, rigid or semi-rigid, depending upon its thickness and the elastic modulus of the dielectric material or materials from which it is fabricated.

Figure 12B:
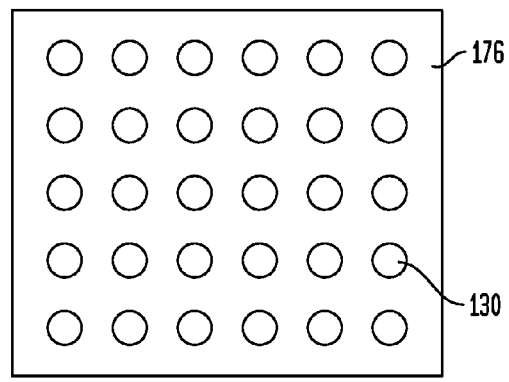
FIG. 12B is a fragmentary plan view corresponding to FIG. 12A of an interconnection element in accordance with one embodiment.

As shown in plan view in FIG. 12B, the posts 130 project above major surface 176 and are typically are laid out in a grid pattern corresponding with a land grid array ("LGA") or ball grid array ("BGA") exposed at the surface of a microelectronic element. Alternatively, the posts 130 can be laid out in a plurality of rows or in a perimeter or radial layout arrangement.

Figure 13A:
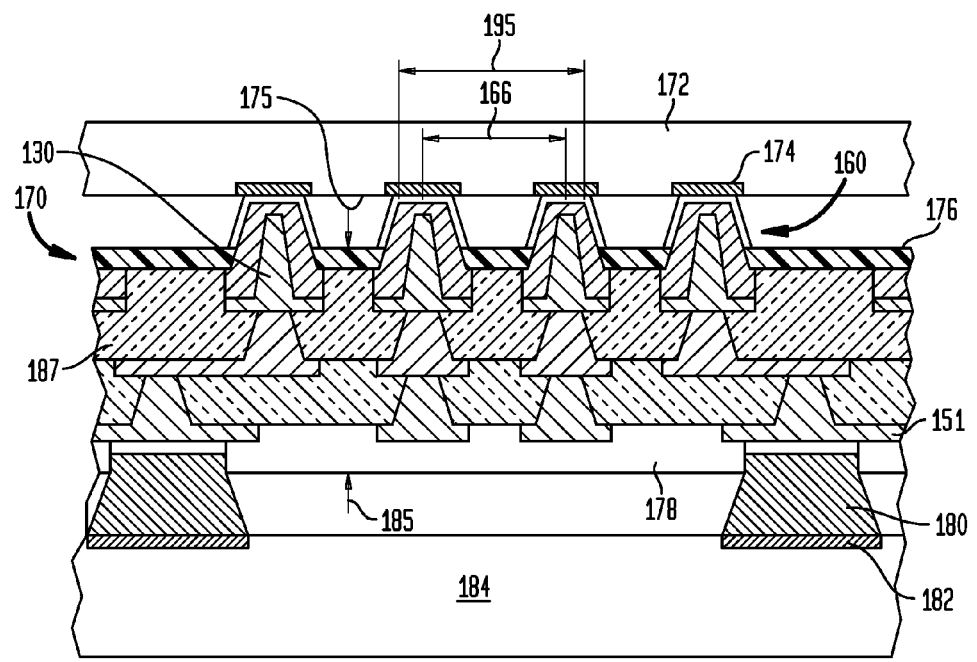
FIG. 13A is a fragmentary sectional view of an interconnection element in accordance with one embodiment, as externally interconnected with other elements.

FIG. 13A illustrates the interconnection element 170 as joined in flip-chip manner with contacts 174 exposed at a major surface 175 of a microelectronic element 172, e.g., a semiconductor chip having active devices, passive devices or both active and passive devices thereon. The interconnection element may function as a fan-out element with features 138 carrying signals, voltages and ground to and from the microelectronic element to locations beyond edges of the microelectronic element.

In one example, the interconnection element can function as a package substrate or chip carrier in a package including the microelectronic element and interconnection element. Thus, in a particular embodiment, the contacts 174 of the chip have a pitch 195 in a left-right direction shown in FIG. 13 and the metal posts 130, 128*a* have a pitch 196 which matches the pitch 195 of the chip contacts 174.

Alternatively, the interconnection element can function as a carrier to which a plurality of microelectronic elements and optionally other circuit elements, e.g., integrated or discrete passive devices or discrete active devices or combination thereof are directly connected.

The tips 160 of the conductive posts, which project outwardly beyond an exposed surface 176 of the solder mask at the upper face of the interconnection element 170, are joined to corresponding conductive pads 174 of the microelectronic element. As illustrated in FIG. 13A, the posts of the interconnection element can be joined directly to the conductive pads, such as through a diffusion bond formed between a finish metal at the tips 160 of the posts, e.g., gold, and another metal present in the conductive pads and the posts. Alternatively, the posts can be joined to the microelectronic element through a fusible metal such as a solder, tin or a eutectic composition, the fusible metal wetting the posts and the pads to form wetted or soldered joints. For example, the fusible metal can be provided in form of solder bumps (not shown), exposed at a surface 175 of the microelectronic element, the bumps being provided on conductive pads 174 having suitable under bump metal structures. In another example, solder masses or tin carried on the tips 160 of the conductive posts can form part of the joints.

The conductive posts 130, which are solid metal structures throughout, have relatively high current-carrying capacity, making the interconnection element suitable for interconnection with microelectronic elements, i.e., chips having high current density. Elements typically included within a processor such as microprocessors, co-processors, logic chips, and the like, have high current density and typically also have high interconnect density (high numbers of relatively fine pitch pads 174). The high current-carrying capacity of the solid metal posts 130 of interconnection element 170 make them suitable for interconnection with such chips. The formation of the metal posts by plating within openings of a mandrel allows one to form metal posts which have frusto-conical shape, essentially cylindrical shape, or other shape as needed.

At a lower face 178 of the interconnection element, terminals 151 can be joined to corresponding terminals 182 of a circuit panel, wiring element, packaged microelectronic element or other conductive element. For example, as illustrated in FIG. 13A, the terminals 151 can be joined to terminals 182 of a circuit panel 184 via conductive masses 180. In one example, the conductive masses 180 can include a fusible metal such as solder, tin or a eutectic composition.

In a variation of the above embodiment, processing which forms the second dielectric layer and fourth metal layer as described above with reference to FIG. 10 is omitted. In such case, the resulting interconnection element does not include the second dielectric layer. Terminals of the interconnection element are formed using the metal features 138 (FIG. 9) of the third metal layer. Such interconnection element may function as a chip carrier to provide fan-out as described above.

Figure 13B:
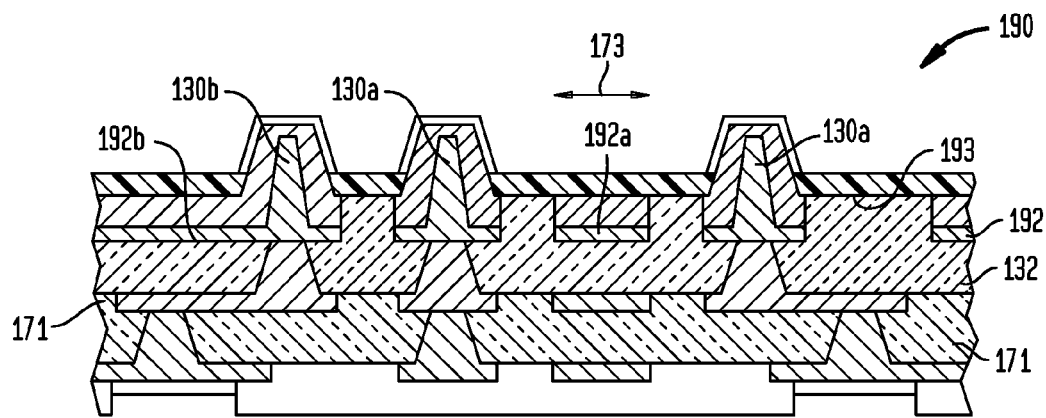
FIG. 13B is a fragmentary sectional view of an interconnection element in accordance with a variation of the embodiment illustrated in FIGS. 12 and 13A.
Figure 14:
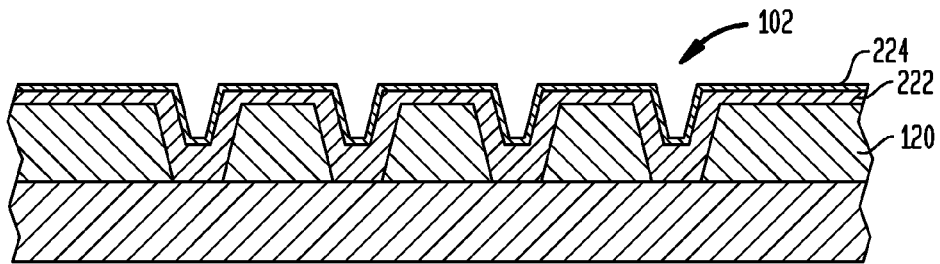
FIGS. 14 through 17 are fragmentary sectional views illustrating a series of stages in a method of fabricating an interconnection element in accordance with a variation of the embodiment illustrated in FIGS. 1 through 12.

FIG. 13B illustrates an interconnection element 190 in accordance with a variation of the embodiment illustrated in FIGS. 12A-B. As seen in FIG. 13B, traces 192, 192*a*, 192*b* extend in at least one direction along a major surface 193 of the dielectric layer 194. For example, the traces 192, 192*a*, 192*b* can extend in the same directions 173 to which the posts depicted in FIG. 13B are aligned. Alternatively, the traces 192, 192*a*, 192*b* can extend in a direction along the major surface of the dielectric layer 194 which is transverse to the direction in which the posts are aligned. For example, the traces 192, 192*a*, 192*b* can be disposed in a direction into and out of the plane in which the interconnect element is depicted in FIG. 12A.

Some traces, e.g., trace 192*a*, can be disposed between adjacent conductive posts 130*a* and can be electrically insulated therefrom by the dielectric element including dielectric layer 132. Although not shown specifically in FIG. 13B, a plurality of traces 192*a* can be disposed between adjacent ones of the metal posts. As depicted in FIG. 13B, traces 192, 192a can be electrically insulated from the metal posts. Alternatively, a trace can be conductively connected to one or more metal posts, in such manner as trace 192b is shown connected with post 130b. In another example, traces 192, 192b shown at edges of FIG. 13B can extend in directions 173 and be connected to other metal posts (not shown) which are disposed at locations along the major surface of the dielectric layer 194 beyond edges 171 of the view depicted in FIG. 13B. Alternatively or in addition thereto, traces 192, 192a, 192b can be extend in a direction transverse to the plane of the drawing of FIG. 12A and be insulated from or connected to metal posts (not shown) which are beyond the view.

The traces 192 including traces 192a, 192b can be formed simultaneously with the posts 130 when the posts 130 are plated onto surfaces of the openings 102, e.g., recesses in the mandrel 118 and then separated by subsequent patterning, e.g., etching in accordance with a masking layer, as described above with reference to FIGS. 5-6.

In another variation, although not specifically depicted in FIG. 13B, traces along the surface of the dielectric element need not be conductively connected to any of the conductive posts.

Figure 15:
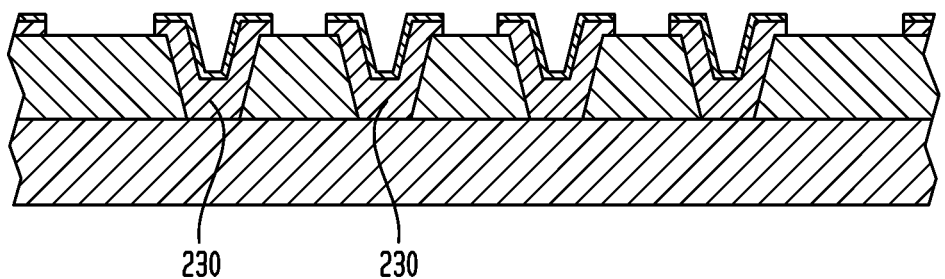

FIGS. 14 through 17 illustrate a method of forming an interconnection element in accordance with a variation of the above-described embodiment. This embodiment varies from that described above in that the second metal layer 224 may not have sufficient thickness to fill the holes 102 in the mandrel 118. For example, a thin conductive layer 224 consisting essentially of copper and having a thickness of a few microns or a few tens of microns can be electroplated onto the metal liner 222. A thin copper layer having a thickness of one to two microns or up to a few tens of microns can be formed, for example, by electroplating copper onto a metal liner 222 consisting essentially of nickel. FIG. 15 illustrates the structure after patterning the second metal layer 224 and metal liner 222 to form conductive posts 230. The metal layers can be patterned in a manner such as described above with reference to FIG. 6.

Figure 16:
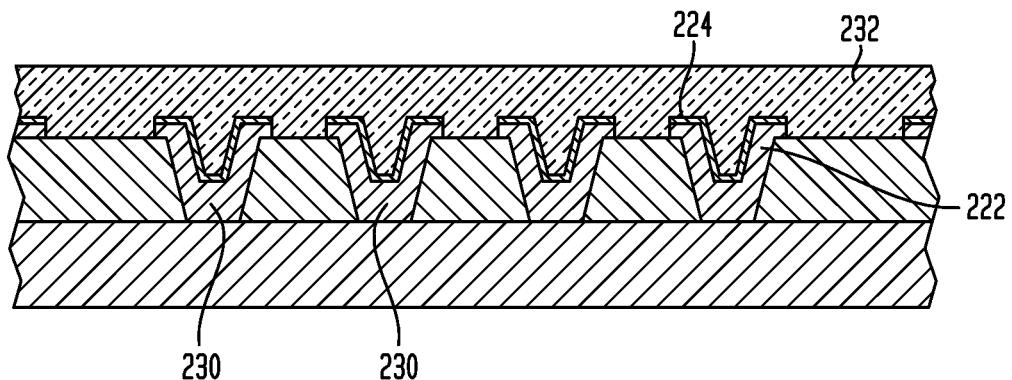

Subsequently, as shown in FIG. 16, a dielectric layer 232 is formed which covers the conductive posts 230, in a manner similar to that described above (FIG. 7). The dielectric layer 232 may or may not extend inward into interior volumes enclosed by the metal layers of the posts 230. As shown in FIG. 16, dielectric material may partially or fully occupy the interior volume enclosed by the metal layers 222, 222 within each post.

Figure 17:
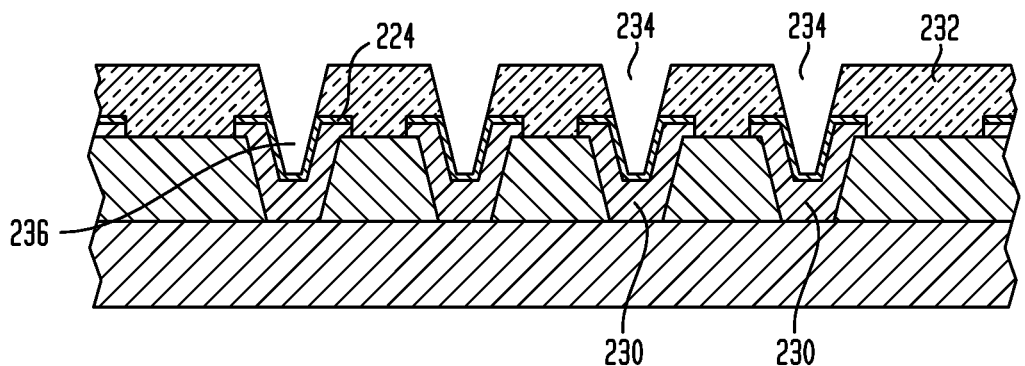

In the stage of processing illustrated in FIG. 17, holes 234 are formed in the dielectric layer 232 in axial alignment with the conductive posts 230, by processing such as that described above (FIG. 8), e.g., with photolithography or laser drilling, for example. As a result of such processing, the dielectric material can be removed from the interior volumes 236 of the conductive posts. The dielectric material is fully removed from interior volumes of the posts as shown in FIG. 17. Thereafter, processing continues in a manner as described above with reference to FIG. 9, except that when the third metal layer 142 is formed, interior volumes of the conductive posts are also filled in the process. Thereafter, steps are performed to complete the interconnection element, as described above with reference to FIGS. 10-12.

Alternatively, at the stage of processing illustrated in FIG. 17, the dielectric material may be only partially removed, such that at least portions of the second metal layer 224 of the conductive posts are exposed. However, some dielectric material may remain within the interior volumes of the posts. Then, the electroplating step (FIG. 9) may fill the interior volumes of the posts only partially, i.e., only to the extent that the interior volumes are not occupied by dielectric material.

Figure 18:
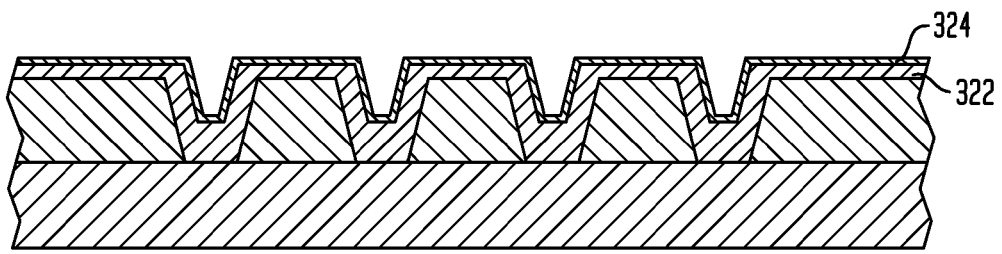
FIGS. 18 through 25 are fragmentary sectional views illustrating a series of stages in a method of fabricating an interconnection element in accordance with one embodiment.
Figure 19:
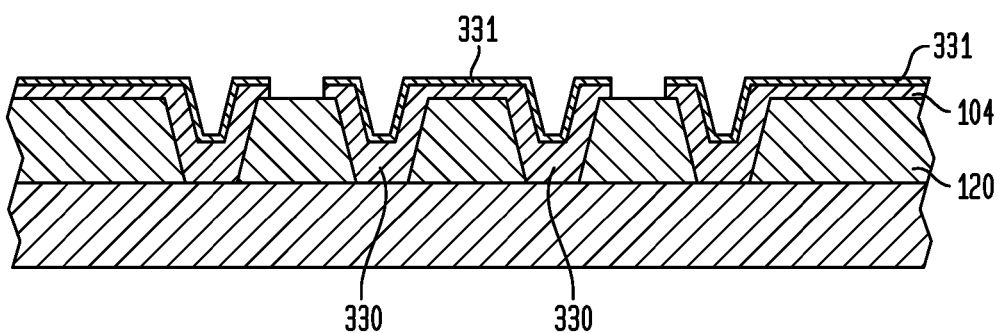

In another variation of the above-described embodiment, a relatively thin second metal layer 324 (FIG. 18) is formed on the metal liner 322, in like manner to that described above with reference to FIG. 14. Thereafter, the second metal layer and metal liner are patterned to form conductive posts 330 (FIG. 19) interconnected by second metal features 331, e.g., traces, metal lines or other metal features extending along a top surface 104 of the mandrel 118.

Figure 20:
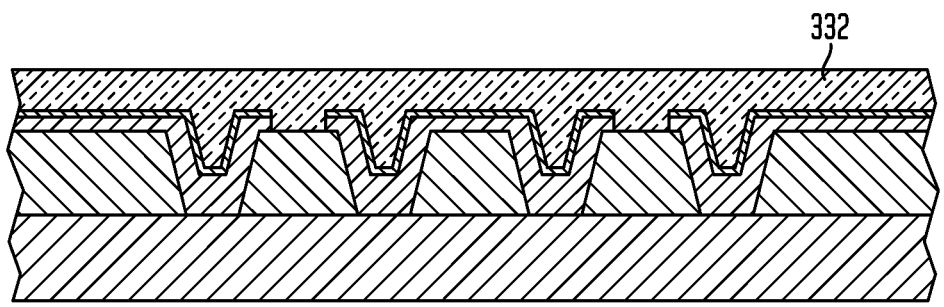
Figure 21:
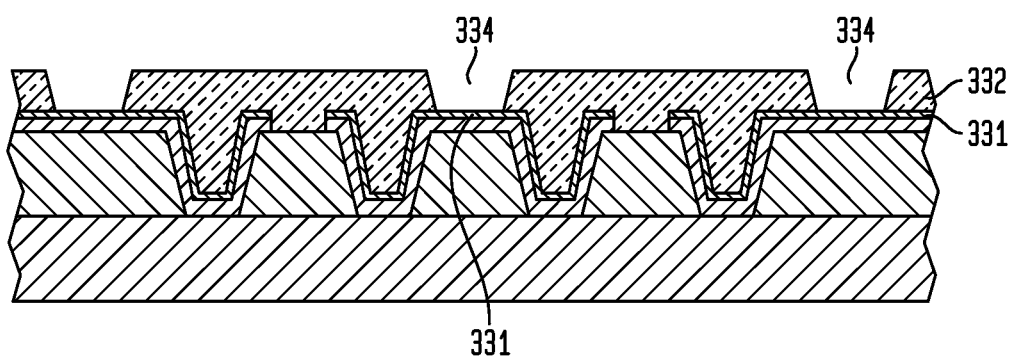
Figure 22:
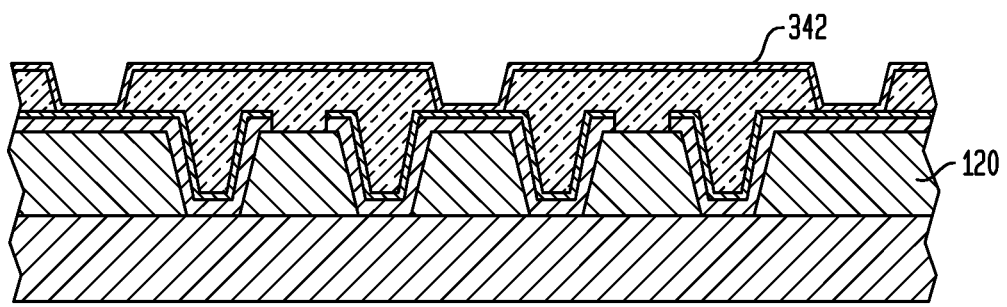

After forming a dielectric layer 332 thereon (FIG. 20), holes 334 (FIG. 21) are formed in the dielectric layer 332 in axial alignment with the second metal features 331 such that at least portions of the second metal features 331 are exposed within the holes. A third relatively thin metal layer 342 (FIG. 22) can then be electroplated onto the structure, which may be preceded by the formation of a seed layer. During the electroplating process, the exposed second metal features 331 serve to provide conductive interconnection to the conductive mandrel 118. The third metal layer 342 can have a thickness ranging from one or two microns and up.

Figure 23:
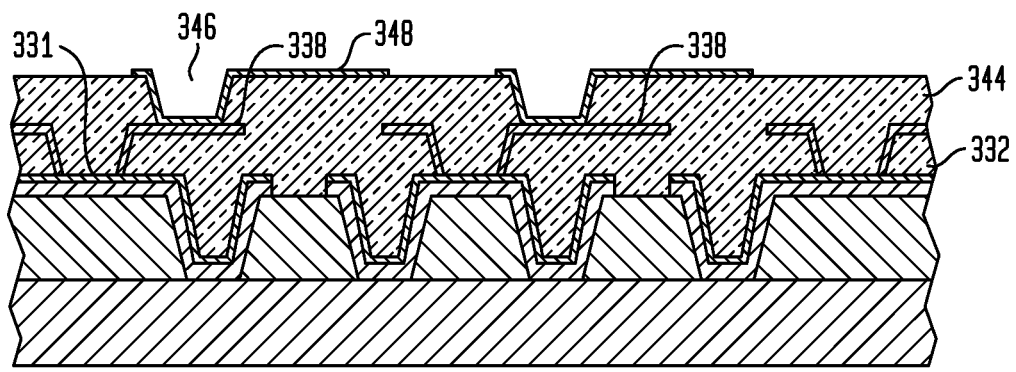

As further illustrated in FIG. 23, the third metal layer can be patterned into individual third metal features 338, e.g., lines, traces, pads or other features conductively connected to the second metal layer below. Some of the metal lines formed thereby extend in directions over the first dielectric layer 332 but may not be conductively connected to the third metal features 331 of the second metal layer. Thereafter, a second dielectric layer 344 can be formed over the first dielectric layer 332 and the third metal features 338 thereon, after which the second dielectric layer 344 is patterned to form holes 346 in axial alignment with the third metal features 338 such that the metal features 338 are exposed within holes 346. A fourth metal layer then is electroplated thereon and patterned to form fourth metal features 348 conductively connected with the third metal features 338.

Figure 24:
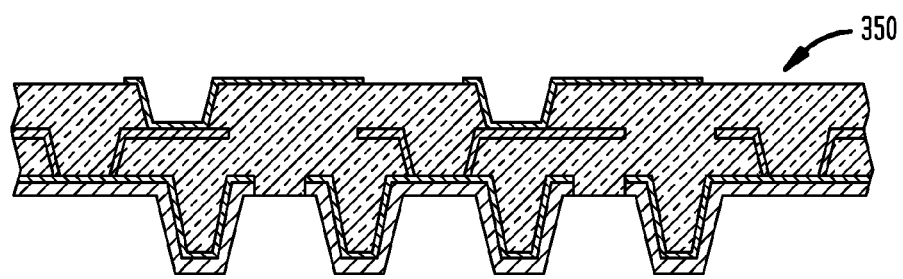
Figure 25:
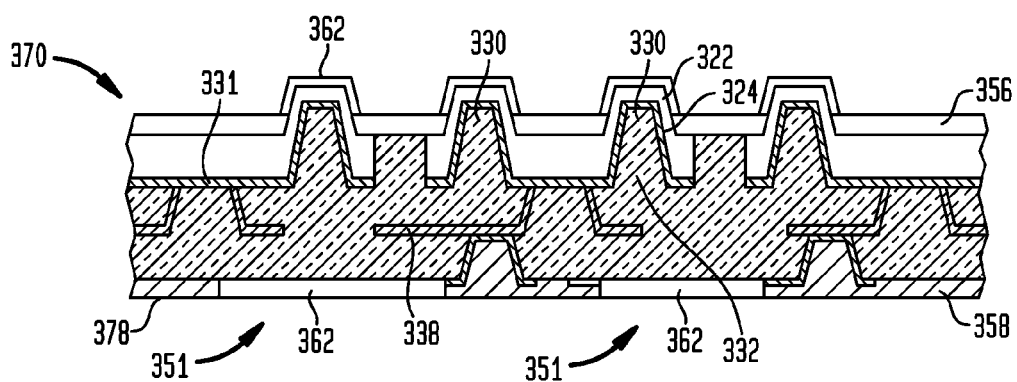

FIG. 24 illustrates the structure 350 after removal of the mandrel, which can be done as described above with reference to FIG. 11. FIG. 25 illustrates a resulting interconnection element 370, after forming solder masks 356 and 356 and a finish metal layer 362 thereon as described above with reference to FIG. 12. As seen in FIG. 25, the interconnection element 370 includes metal posts 330 having plated metal layers 322, 322 that do not fill the entire volumes of the posts. Instead, a dielectric material may fill interior volumes of the posts. The metal posts 330 are interconnected by way of the second, third and fourth metal features 331, 336 and 346 to terminals 351 exposed at a major surface 378 of the interconnection element 370 opposite from the conductive posts.

The conductive posts 330 of interconnection element 370, which are not solid metal structures throughout, have somewhat lower current-carrying capacity than the above-described interconnection element 170 (FIG. 12). It may be possible to produce the interconnection element 370 at lower cost, if the conductive posts and other metal features therein can be plated in less time than the time required to make the comparable metal posts, vias and metal features of interconnection element 170 (FIG. 12). The lower current-carrying capacity of interconnection element 370 may also be better suited to certain types of chips which have lower current density, such as, for example, memory chips.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An interconnection element for conductive interconnection with another element having at least one of microelectronic devices or wiring thereon, comprising:
   a dielectric element having a major surface;
   a plated metal layer including a plurality of exposed metal posts, each post projecting from a base of each post outwardly beyond the major surface of the dielectric element to a tip of each post, at least some of the metal posts electrically insulated from each other by the dielectric element, the posts being defined by plating a metal onto exposed co-planar surfaces of a mandrel and interior surfaces of openings in a mandrel and subsequently removing the mandrel such that the tips of the posts are co-planar with one another, at least one of the posts defining an interior volume between the base and the tip of such post, material of the dielectric element at least partially occupying the interior volume; and
   a plurality of terminals in conductive communication with the metal posts, the terminals being connected through the dielectric element to the metal posts,
   wherein the plated metal layer includes an inner metal layer having a surface defining the interior volume and an outer metal layer at least partially occupying the interior volume, the inner metal layer further including a plurality of metal wiring traces extending in at least one direction along the major surface of the dielectric element, at least some of the plurality of metal wiring traces extending between at least two of the plurality of exposed metal posts and conductively connecting the at least two conductive posts.

2. The interconnection element as claimed in claim 1, wherein other of the plurality of metal wiring traces are electrically insulated from the metal posts.

3. The interconnection element as claimed in claim 2, wherein at least one of the metal wiring traces is connected to an adjacent one of the metal posts.

4. The interconnection element as claimed in claim 1, wherein one or more metal wiring traces are disposed between adjacent ones of the metal posts and is insulated from the adjacent metal posts.

5. The interconnection element as claimed in claim 1, wherein the plurality of metal traces are integral with the metal posts.

6. The interconnection element as claimed in claim 1, wherein portions of the dielectric element are disposed between at least one metal wiring trace of the metal layer and the adjacent metal posts.

7. The interconnection element as claimed in claim 1, wherein at least one of the inner metal layer and outer metal layer connects the terminals with the metal posts through the dielectric element.

8. The interconnection element as claimed in claim 7, wherein the inner metal layer is conductively joined to bases of the metal posts.

9. The interconnection element as claimed in claim 1, wherein the metal posts have a height of at least 35 microns from the major surface and a pitch smaller than about 150 microns.

10. The interconnection element as claimed in claim 1, wherein each metal post has frusto-conical shape.

11. The interconnection element as claimed in claim 1, wherein each metal post comprises a substantially cylindrical shape.

12. A packaged microelectronic element including the interconnection element as claimed in claim 1, and a microelectronic element including a plurality of exposed contacts having a pitch, wherein the metal posts have a pitch matching the pitch of the contacts, the metal posts being conductively joined to the contacts.

13. The packaged microelectronic element as claimed in claim 12, wherein the metal posts have a height of at least 35 microns from the major surface and a pitch smaller than about 150 microns.

14. The interconnection element as claimed in claim 1, wherein the inner metal layer is formed by plating a metal onto the outer metal layer.

15. The interconnection element as claimed in claim 14, wherein the outer metal layer includes nickel and the inner metal layer includes copper.

16. A packaged microelectronic element including the interconnection element as claimed in claim 1 and a microelectronic element including a plurality of exposed contacts having a pitch, wherein the metal posts have a pitch matching the pitch of the contacts, the metal posts being joined to the contacts with a fusible metal.

17. The interconnection element of claim 1, wherein the outer metal layer extends along the surface of the metal layer.

18. The interconnection element of claim 1, wherein the plurality of metal wiring traces is a first plurality of metal traces and wherein the outer metal layer further comprises a second plurality of metal wiring traces overlying the first plurality of metal traces.

19. The interconnection element of claim 1, wherein the dielectric overlies the inner and outer metal layers.

* * * * *